US012696686B2

(12) United States Patent
Shabanian et al.

(10) Patent No.: US 12,696,686 B2
(45) Date of Patent: Jul. 28, 2026

(54) PIEZOELECTRIC ACTUATOR AND MICROFLUIDIC DEVICE

(71) Applicant: Albert-Ludwigs-Universitat Freiburg, Freiburg (DE)

(72) Inventors: Ardavan Shabanian, Freiburg (DE); Hans Rainer Stork, Schallstadt (DE); Anjan Bhat Kashekodi, Freiburg (DE); David Stork, Freiburg (DE); Peter Woias, Freiburg (DE); Frank Goldschmidtboing, Ortenberg (DE)

(73) Assignee: Albert-Ludwigs-Universitat Freiburg, Freiburg (DE)

( * ) Notice: Subject to any disclaimer, the term of this patent is extended or adjusted under 35 U.S.C. 154(b) by 1039 days.

(21) Appl. No.: 17/554,773

(22) Filed: Dec. 17, 2021

(65) Prior Publication Data
US 2022/0109097 A1     Apr. 7, 2022

Related U.S. Application Data

(63) Continuation of application No. PCT/EP2020/066811, filed on Jun. 17, 2020.

(30) Foreign Application Priority Data

Jun. 19, 2019     (EP) .................................... 19181387

(51) Int. Cl.
H01L 41/09 (2006.01)
F04B 43/04 (2006.01)
(Continued)

(52) U.S. Cl.
CPC ....... H10N 30/2047 (2023.02); F04B 43/046 (2013.01); F16K 99/0015 (2013.01); F16K 99/0048 (2013.01)

(58) Field of Classification Search
CPC ........................ H10N 30/2047; H10N 30/2048
See application file for complete search history.

(56) References Cited

U.S. PATENT DOCUMENTS 7,038,355 B2 * 5/2006 Bouche .................... H01G 5/16
                                                            310/306
8,319,396 B2    11/2012 Onishi et al.
(Continued)

FOREIGN PATENT DOCUMENTS

CN         101336562 B     11/2012
DE      102005038483 B3     12/2006
(Continued)

OTHER PUBLICATIONS

English Translation of JP 2015149368 (Year: 2015).*
(Continued)

*Primary Examiner* — Bryan P Gordon
(74) *Attorney, Agent, or Firm* — Barley Snyder

(57) ABSTRACT

A piezoelectric actuator includes a deflectable membrane and a piezoelectric element attached to a part of the deflectable membrane for exerting a mechanical force on the deflectable membrane. The piezoelectric element is operable to perform an expansion and a contraction motion depending on an electric field applied to the piezoelectric element. The piezoelectric element leaves open a central region of the deflectable membrane and has a peripheral outline that does not coincide with an outline of the deflectable membrane.

45 Claims, 9 Drawing Sheets

(51) Int. Cl.
F16K 99/00 (2006.01)
H10N 30/20 (2023.01)

(56) References Cited

U.S. PATENT DOCUMENTS

| | | | |
|---|---|---|---|
| 8,454,327 B2 | 6/2013 | Hirata et al. | |
| 10,324,236 B2 | 6/2019 | Moreau et al. | |
| 2006/0119218 A1 | 6/2006 | Doshida et al. | |
| 2010/0327702 A1* | 12/2010 | Martin | G01K 7/32 |
| | | | 29/25.35 |
| 2012/0170920 A1 | 7/2012 | Moreau et al. | |
| 2013/0294201 A1* | 11/2013 | Hajati | G01N 29/2406 |
| | | | 310/334 |
| 2013/0327702 A1 | 12/2013 | Wu et al. | |
| 2014/0084395 A1 | 3/2014 | Sparks et al. | |
| 2014/0104696 A1* | 4/2014 | Moreau | G02B 3/14 |
| | | | 359/665 |
| 2014/0169996 A1* | 6/2014 | Tanaka | H10N 30/2042 |
| | | | 417/410.2 |
| 2022/0093842 A1* | 3/2022 | Khan | H10N 30/88 |
| 2022/0109097 A1* | 4/2022 | Shabanian | H10N 30/2047 |

FOREIGN PATENT DOCUMENTS

| | | | |
|---|---|---|---|
| JP | H07240547 | A | 9/1995 |
| JP | 2006141102 | A | 6/2006 |
| JP | 2013504779 | A | 2/2013 |
| JP | 2015149368 | A | 8/2015 |
| JP | 2015149632 | A | 8/2015 |
| JP | 2015522444 | A | 8/2015 |
| JP | 2016053735 | A | 4/2016 |
| KR | 20140128273 | A | 11/2014 |
| WO | 2011007645 | A1 | 1/2011 |
| WO | 2013173495 | A1 | 11/2013 |
| WO | 2018035542 | A1 | 2/2018 |
| WO | 2018050534 | A1 | 3/2018 |
| WO | 2019099013 | A1 | 5/2019 |

OTHER PUBLICATIONS

Japanese Office Action dated Jan. 20, 2024 with English translation, corresponding to Application No. 10-2022-7001571, 10 pages.
Japanese Notice of Reason for Refusal dated Jun. 21, 2024 (with English translation thereof), corresponding to Application No. 2021-575493, 15 pages.
Japanese Office Action dated Apr. 22, 2025 with English translation, corresponding to Application No. 2021-575493, 12 pages.

* cited by examiner

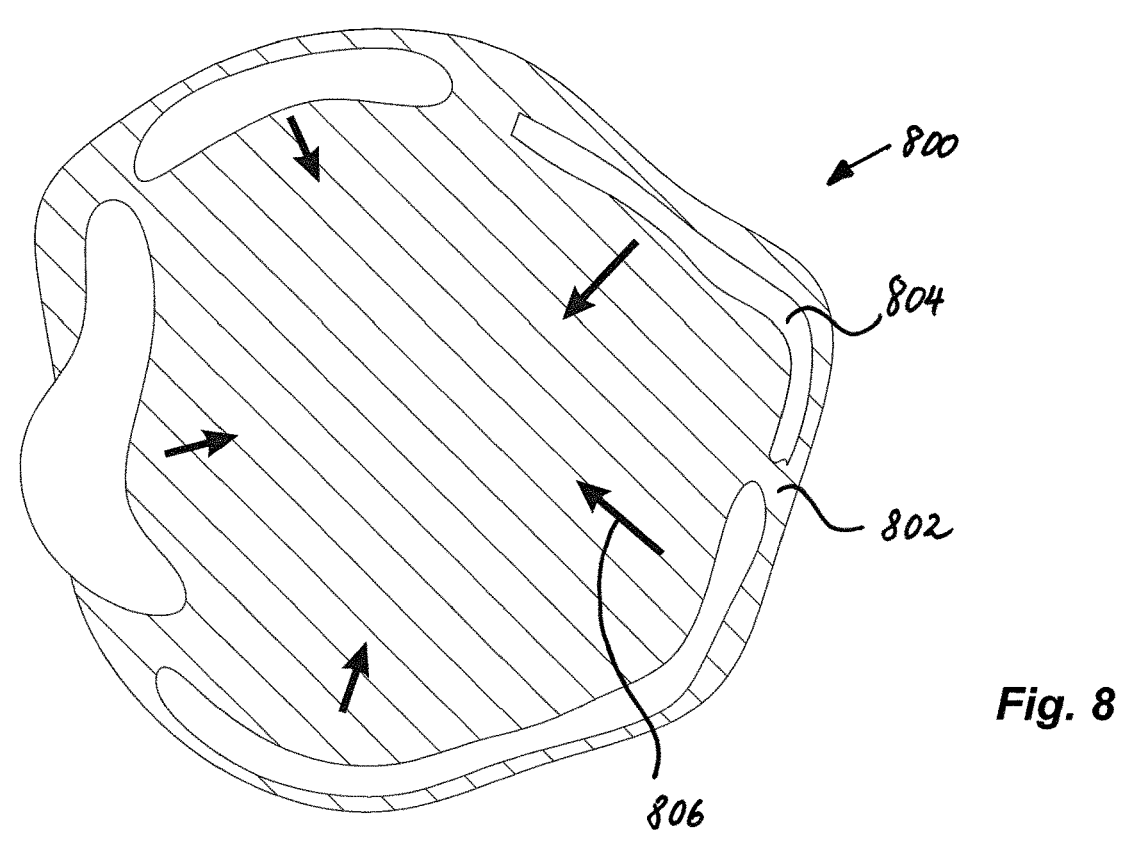
Fig. 8
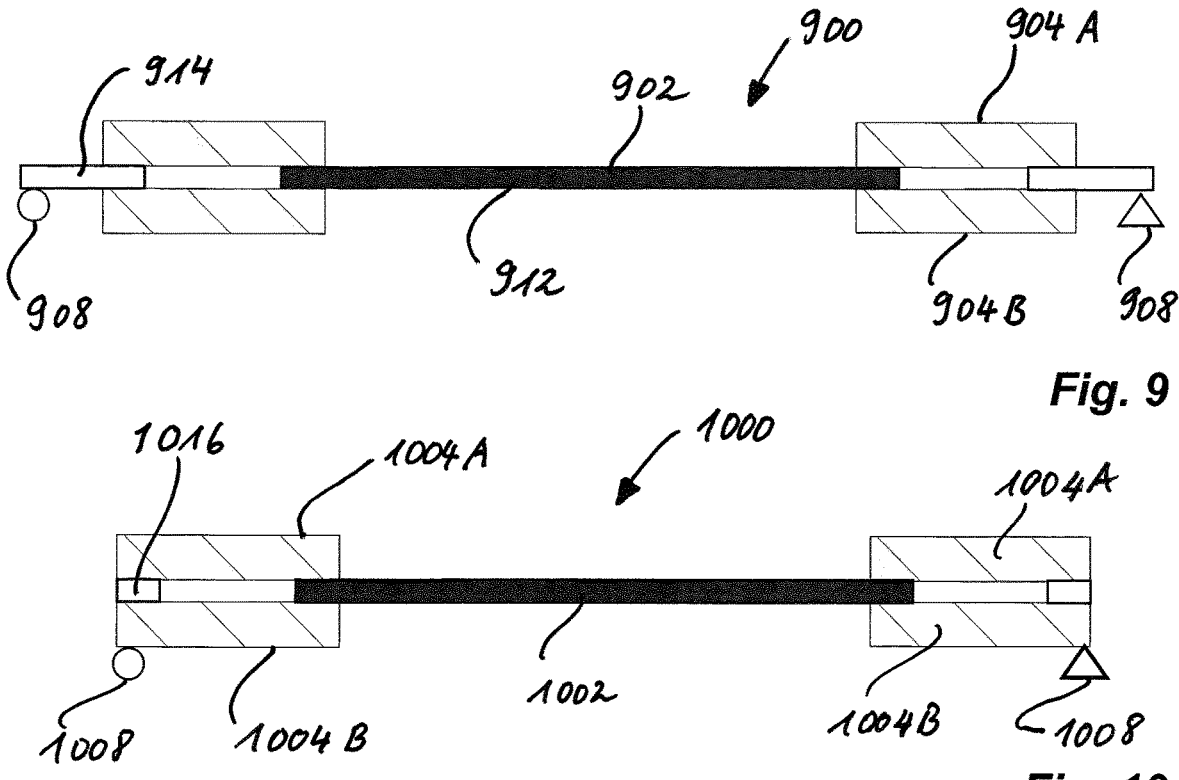
Fig. 9
Fig. 10

1100
1112
1104A
1106A
1102
1110
1104B
1106B 1216
1214
1204A
1202
1212
1204B

1200

1216
1314
1304
1306
1310
1302

1300

1420
1414
1416
1402
1406
1406
1404
1412
1418
1422

1400

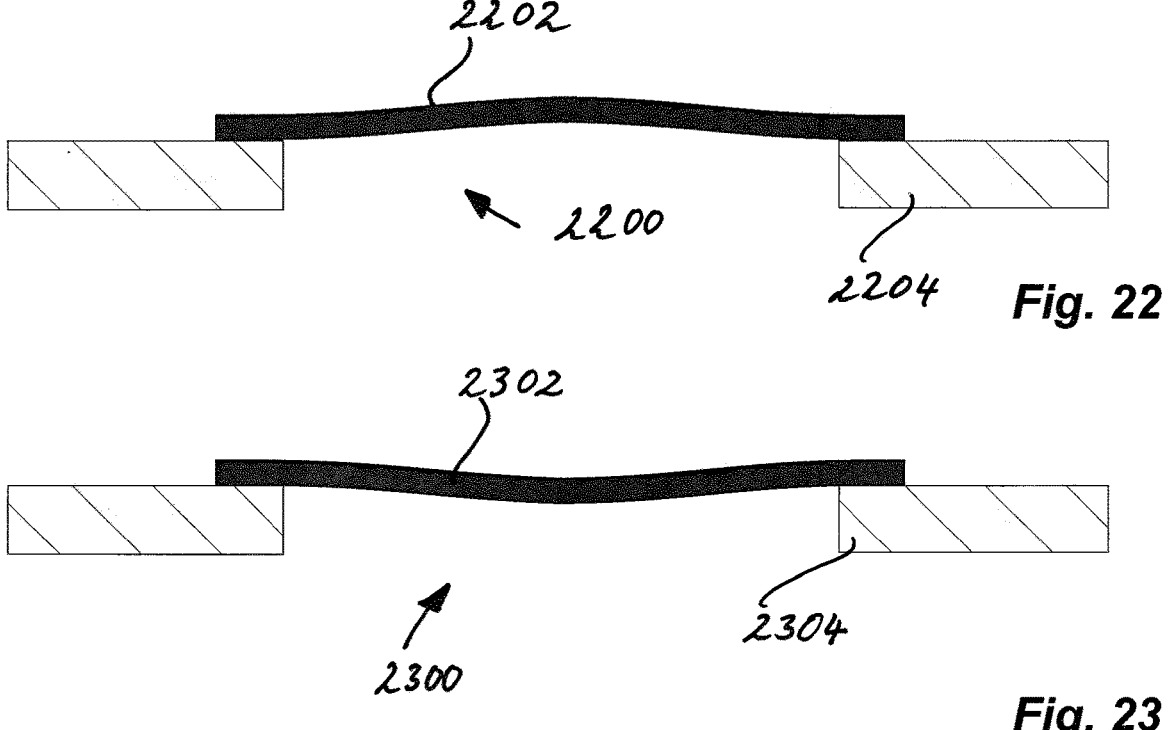
Fig. 22
Fig. 23
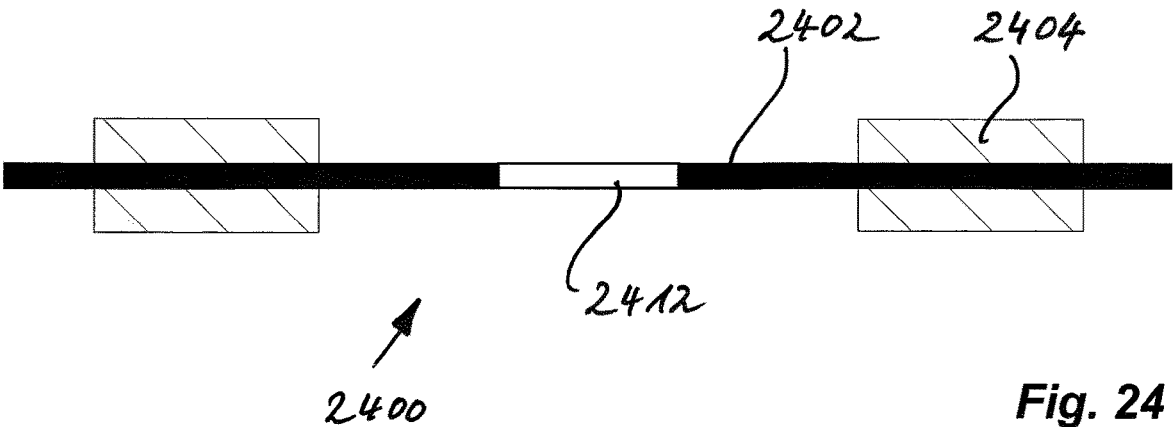
Fig. 24

PIEZOELECTRIC ACTUATOR AND MICROFLUIDIC DEVICE

CROSS-REFERENCE TO RELATED APPLICATIONS

This application is a continuation of PCT International Application No. PCT/EP2020/066811, filed on Jun. 17, 2020, which claims priority under 35 U.S.C. § 119 to European Patent Application No. 19181387.2, filed on Jun. 19, 2019.

FIELD OF THE INVENTION

The present invention relates to a piezoelectric actuator and to a microfluidic device, such as a microvalve or micropump.

BACKGROUND

For decades, piezo-membrane actuators have been used to provide precise movements, high forces, and low energy performances. Several configurations such as unimorph, bimorph, stack actuators, etc. are proposed to improve the performance of these actuators, and to increase their lifetime. Most of these actuators are in the form of multi-layer structures of piezo materials as active components mounted on other materials such as metal, polymer or glass as passive membranes. Due to their intrinsic electro-mechanical characteristics, there is a strain produced in the piezo material when an external voltage is applied, which results in a bending moment as the strain in the piezo material is restrained by the passive layers. A lot of research is done to improve the performances of these actuators, for example by optimizing the bending moment to stiffness ratio of the multi-layered actuator. Others have tried to optimize the electrical field applied by changing the metallization layers and electrodes of the actuators in various array or spiral shapes.

FIGS. 29 to 31 depict a conventional piezoelectric actuator 10 in three different operational states. For developing a buckling actuator membrane 12, it is known to sandwich the membrane 12 (also often referred to as "diaphragm") between two piezoelectric rings 14A, 14B, with the membrane 12 and piezoelectric elements 14A, 14B having a flat structure with a constant thickness, and the membrane 12 having the same outer dimensions as the outer dimension of the piezo elements 14A, 14B.

Furthermore, Chinese Patent No. CN101336562B discloses a piezoelectric actuator which comprises a piezoelectric element for performing expansion/contraction motions in accordance with an electric field condition, a seat to which the piezoelectric element is adhered on at least one surface thereof, and a supporting member for supporting the piezoelectric element and the seat, wherein the piezoelectric element and the seat vibrate up and down in accordance with the expansion/contraction motions of the piezoelectric element. The seat is connected to a supporting member through a vibration film which is less rigid than this seat. However, the surrounding member is only a passive material to provide the surrounding support, and not an active member to induce and control the bending moments and buckling forces.

Further, Korean Patent No. KR20140128273A aims to provide a method for compensating low generating force and little displacement, which are disadvantages of the prior piezoelectric bender actuator. Additionally, the document aims to provide a piezoelectric bender actuator capable of controlling generating force and displacement exactly. According to an embodiment, the piezoelectric bender actuator includes: a piezoelectric plate that includes a piezoelectric ceramic in the shape of a bar, and a base plate, which is attached to a lower side of the piezoelectric ceramic and is longer than the piezoelectric ceramic; and compressing members which are located on both end portions of the piezoelectric plate and can compress the piezoelectric plate in parallel with the lengthwise direction. The piezoelectric plate is buckled in one direction when the compressing members compress both sides of the piezoelectric plate in the absence of an electric field. The piezoelectric plate is buckled in the other direction in the presence of an electric field. However, the compressing member is not a piezoelectric element.

International Patent Application Publication No. WO2018035542A1 relates to piezoelectric energy harvesting using a nonlinear buckled beam. An energy harvester includes a frame having a base, a first side member affixed to the base, and a second side member affixed to the base and spaced apart from the first side member. A beam is coupled between the first side member of the frame and the second side member of the frame. The beam has a substrate layer with a first end affixed to the first side member of the frame, a second end affixed to the second side member of the frame, a first face, and a second face opposite to the first face. The substrate is elastically deformable in response to the vibratory force. The beam further includes a first piezoelectric layer joined to the first face of the substrate layer and having a terminal for electrical connection to a load, the first piezoelectric layer comprising at least one piezoelectric patch. The frame described in FIG. 1 of WO2018035542A1 is only to provide a passive and rigid support to create buckling, and does not have an active role in applying and controlling the bending and buckling.

Finally, U.S. Pat. No. 8,454,327B2 discloses a piezoelectric micropump in which a pump chamber is isolated by a diaphragm. A piezoelectric element is disposed on a back surface of the diaphragm, and the diaphragm is deformed by bending deformation of the piezoelectric element to change the volume of the pump chamber and transport fluid in the pump chamber. A support member for supporting a back surface of the piezoelectric element is provided so that the support member inhibits bending of a peripheral portion of the diaphragm in a reverse direction. The support member thus prevents the piezoelectric element from being floated. Accordingly, the displacement of the piezoelectric element can be reliably transmitted as the change in volume of the pump chamber, thereby enhancing the fluid transportation performance. However, member 1d shown in FIG. 8 of U.S. Pat. No. 8,454,327B2 describes a block (support member), and not an active piezoelectric member.

Yet several intrinsic aspects of the piezo ceramics seem to limit their application where large deflections are required. One is the natural stiffness of these materials that are often in the form of ceramics with stiffness levels of some tens of GPa, in the same range of Aluminum. Therefore the piezo itself greatly contributes to the undesired bending stiffness of the actuator, which in turn leads to the reduced achieved deflection of the entire structure. In addition, the large stiffness corresponds to the large stresses created in the material even under small strains, which is the second intrinsic characteristic of these materials that makes realizing large deflections so challenging; the brittle nature of these materials. In other words, even if a configuration could achieve large deflections despite the high bending stiffness of the piezo materials, it would not be able to reach to strains more than some tenths of percent, due to the brittle nature of these materials.

Therefore, there is still a need for an improved piezo-actuation concept, which combines buckling forces with bending moments, resulting in higher deflection and increased lifetime of the piezoelectric actuator.

SUMMARY

A piezoelectric actuator includes a deflectable membrane and a piezoelectric element attached to a part of the deflectable membrane for exerting a mechanical force on the deflectable membrane. The piezoelectric element is operable to perform an expansion and a contraction motion depending on an electric field applied to the piezoelectric element. The piezoelectric element leaves open a central region of the deflectable membrane and has a peripheral outline that does not coincide with an outline of the deflectable membrane.

BRIEF DESCRIPTION OF THE DRAWINGS

The invention will now be described by way of example with reference to the accompanying Figures, of which:

FIG. 8 shows a schematic top view representation of a piezoelectric actuator according to a further embodiment;

FIG. 9 shows a schematic cross-sectional representation of a piezoelectric actuator according to a further embodiment;

FIG. 10 shows a schematic cross-sectional representation of a piezoelectric actuator according to a further embodiment;

FIG. 22 shows a schematic cross-sectional representation of a piezoelectric actuator according to a further embodiment;

FIG. 23 shows a schematic cross-sectional representation of a piezoelectric actuator according to a further embodiment;

FIG. 24 shows a schematic cross-sectional representation of a piezoelectric actuator according to a further embodiment;

DETAILED DESCRIPTION OF THE EMBODIMENT(S)

Figure 1:
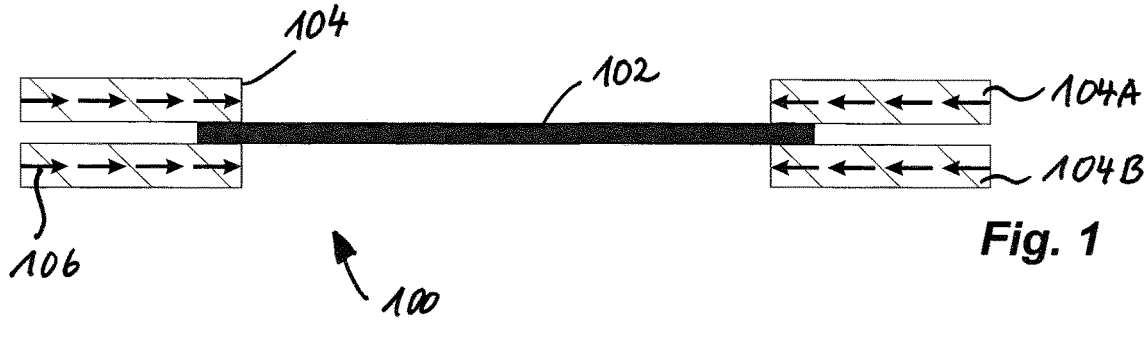
FIG. 1 shows a schematic cross-sectional representation of a piezoelectric actuator according to a first embodiment.

The accompanying drawings are incorporated into and form a part of the specification to illustrate embodiments of the present invention. These drawings, together with the description, explain the principles of the invention. The drawings are merely for the purpose of illustrating the examples of how the invention can be made and used and are not to be construed as limiting the invention to only the illustrated and described embodiments. Furthermore, several aspects of the described embodiments may form—individually or in different combinations—solutions according to the present invention. Further features and advantages will become apparent from the following more particular description of the various embodiments of the invention, as illustrated in the accompanying drawings, in which like references refer to like elements.

The term "rigid" as used in this application is meant stiff, unyielding, i.e. a rigid structure is not adapted to be deformable during normal use of the structure.

The term "flexible" as used in this application is meant non-stiff, non-rigid, i.e. the material can undergo elastic deformation, regaining its original shape as long as it has not entered into the plastic region.

The term "stretchable" as used in this application is meant resilient, i.e. elastically deformable with elongation. A stretchable structure is adapted to be elastically deformed during normal use (with elongation).

The term "compressible" as used in this application is meant resilient, i.e. elastically deformable with a reduction of size in the direction of an applied pressure. A compressible structure is adapted to be elastically deformed during normal use (with reduction of dimension).

The present invention is based on the finding that actuators can be developed with a better control by combining the bending and buckling forces, and achieving higher performance in terms of deflection and force/pressure capabilities, if the membrane and the piezoelectric element do not have an identical outline. Instead, the membrane's dimension is smaller or larger than those of the piezoelectric elements (in the following also sometimes referred to as "piezo element").

Advantageously, according to the present invention, the actuator is designed so that in operation buckling and bending forces can be combined in both deflection directions of the actuator membrane. In other words, compressive forces can be generated for both directions of the deflection, in addition to the bending forces.

In particular, a piezoelectric actuator according to the present invention comprises a deflectable actuator membrane, and at least one piezoelectric element operable to perform expansion and contraction motion depending on an electric field applied to the piezoelectric element, wherein the piezoelectric element is attached to a part of the actuator membrane for exerting mechanical force on the membrane, and wherein the piezoelectric element leaves open a central region of the membrane and has a peripheral outline that does not coincide with an outline of the actuator membrane.

Referring now to the drawings and in particular first to FIG. 1, the present invention will be explained in more detail.

FIG. 1 shows a schematic cross-sectional representation of a piezoelectric actuator 100 according to a first exemplary aspect of the present invention. the piezoelectric actuator 100 comprises a deflectable membrane 102 and two ring-shaped piezoelectric elements 104A, 104B. Throughout the specification, the piezoelectric elements 104A, 104B may each alternatively and more generally be referred to as the piezoelectric element 104. In the shown embodiment, the piezoelectric elements 104A, 104B are two ring-shaped planar plates, which are attached to the membrane 102 to cover a ring-shaped peripheral region of the membrane 102 with a ring-shaped inner region of the piezoelectric element 104A, 104B.

As indicated by the arrows 106, the piezoelectric elements 104A, 104B exert an inwardly directed force when an electric field is applied to the piezoelectric elements 104A, 104B. It has to be noted that, throughout the present disclosure, the electrodes of the piezoelectric elements 104A, 104B are shaped according to their polarization as this is known to a person skilled in the art to cause the piezoelectric element 104A, 104B to provide inward or outward forces (compression and tension), but are not shown in the drawings in order to avoid obscuring the general ideas. The piezoelectric elements 104A, 104B may be mechanically connected to the membrane 102 in any suitable manner, for instance by an adhesive layer or the like.

According to the present invention, the membrane 102 has a smaller dimensions than the piezoelectric elements 104A, 104B; the membrane 102 has a smaller diameter than the outer diameter of the piezoelectric elements 104A, 104B.

In other words, the piezoelectric elements 104A, 104B are in mechanical contact with the membrane 102 in the region which is much smaller than the surface of the piezoelectric elements 104A, 104B. For instance, the piezoelectric elements 104A, 104B may be attached to the membrane 102 with a proportion of their overall area of around 20%. However, other proportions are of course possible and it has to be noted that all the Figures are not drawn to scale regarding distances as well as thicknesses.

Figures 29, 30, 31:
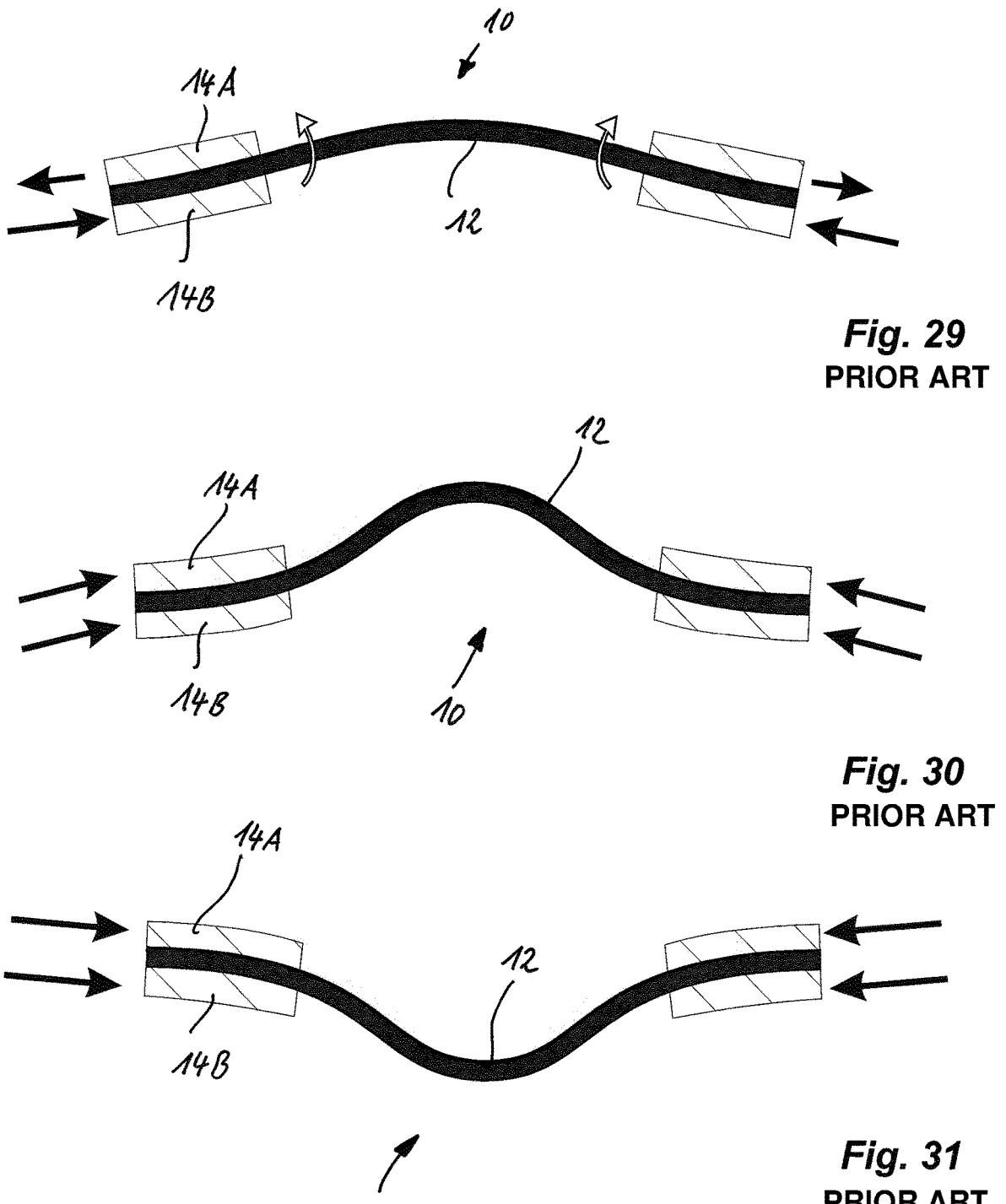
FIG. 29 shows a schematic cross-sectional representation of a known piezoelectric actuator in a first operational state.
FIG. 30 shows a schematic cross-sectional representation of a known piezoelectric actuator in a second operational state.
FIG. 31 shows a schematic cross-sectional representation of a known piezoelectric actuator in a third operational state.

By combining the bending and buckling of the membrane 102 for instance in the same manner as shown in FIGS. 29 to 31, a better control is possible and a higher performance can be achieved in terms of deflection and force and/or pressure capabilities.

The advantages of a smaller membrane 102 dimension can be more easily explained in an energy analysis approach. The energy of the piezo materials results in the deformation energy of the actuator and the external work done by the actuator (such as displacing a liquid). Therefore, if the membrane 102 has a bigger area, the deformation energy is consumed in compressing and deforming a bigger area of the membrane 102, namely the entire membrane, and the corresponding adhesive which is transferring the stress from the piezo rings to the membrane. In contrast thereto, with a smaller membrane area 102 (such as the one shown in FIG. 1), the deformation energy is used more efficiently in the central region of the membrane 102, resulting in more deflection and achieving more external work. Therefore, as the most important area of the membrane 102 which does the actual mechanical work is the region inside the piezo sections, reducing the membrane 102 size ideally only to this region can considerably increase the performance, beside reducing the material costs.

Moreover, the membrane 102 can have an initial curvature, for example due to a pre-stress such as pre-bending or pre-buckling, to pronounce an asymmetric deflection/force in the desired direction. Furthermore, this curvature will reduce the required force to achieve a certain deflection.

Figure 2:
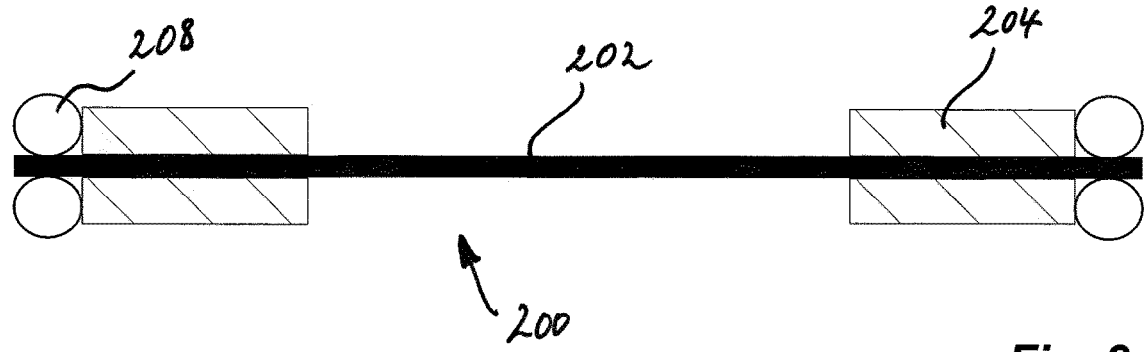
FIG. 2 shows a schematic cross-sectional representation of a piezoelectric actuator according to a second embodiment.

On the other hand, as shown in FIG. 2, a piezoelectric actuator 200 may comprise a membrane 202 which is larger in diameter than the piezoelectric elements 204. The piezoelectric element 204 comprises at least one ring-shaped planar plate which is attached to the membrane 202 and has an outer diameter that is smaller than an outer diameter of the membrane 202. This extension of the membrane 202 beyond the piezoelectric elements' 204 dimensions can be used for mounting/support purposes (as shown in FIG. 2), creating a longer moment arm (compared to the case that the mounting/support area is limited within the piezo dimensions) thus allowing for a larger achieved deflection. In FIG. 2, support elements 208 are schematically shown as O-rings. It is clear for a person skilled in the art that any suitable form of support element 208 may of course also be used.

In the context of the present invention, "ring-shaped" means a structure which surrounds an empty center with a closed or partially interrupted area having an inner outline and an outer outline. The ring shape in particular is not restricted to circular outlines, but also includes any arbitrary outline, for instance oval, rectangular, or irregular. Furthermore, it should be noted that in the plane of the membrane, neither the membrane nor the piezoelectric element need to be symmetric. The inner and outer outline of the piezoelectric element also do not have to possess central similarity with respect to each other.

Figure 3:
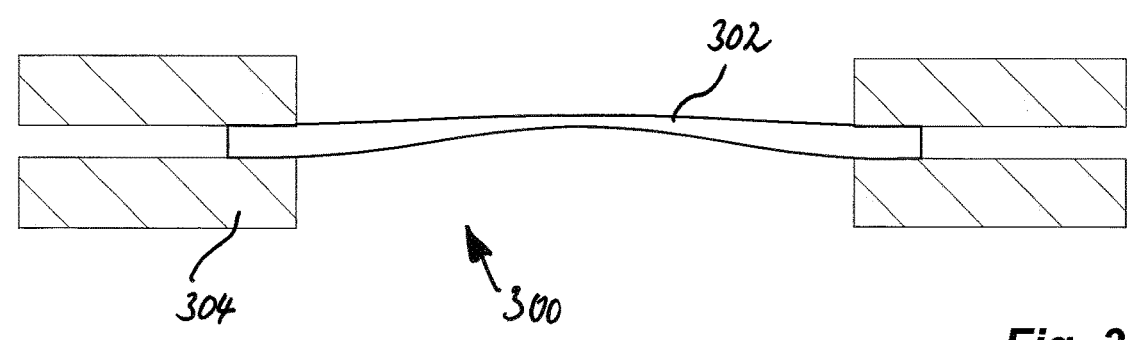
FIG. 3 shows a schematic cross-sectional representation of a piezoelectric actuator according to the first embodiment having a first membrane configuration with varying thickness.
Figure 4:
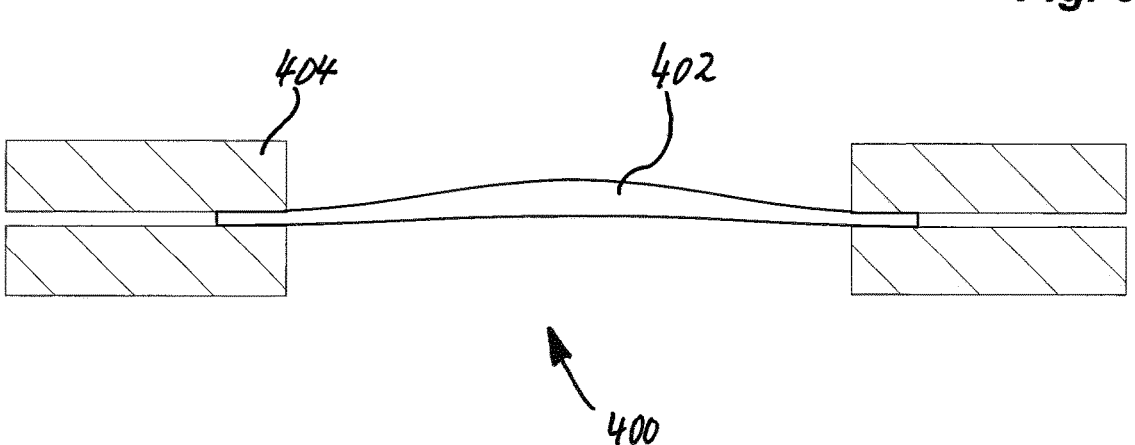
FIG. 4 shows a schematic cross-sectional representation of a piezoelectric actuator according to the first embodiment having a second membrane configuration with varying thickness.

A further advantageous variation of the piezoelectric actuator 300 is shown in FIG. 3. Here, the membrane 302 has a thickness that is reduced in the center compared to the peripheral region. On the other hand, FIG. 4 shows a piezoelectric actuator 400 with a membrane 402 that is thicker in the center compared to the marginal region, which is in contact with the piezoelectric elements 404.

As the thickness of the membrane contributes with the third power to the flexural rigidity, the increased thickness in the center (such as the example shown in FIG. 4) results in a higher transferred moment through the membrane and thus higher working pressure, i. e. the actuator 400 can deflect against higher pressures and/or forces. The disadvantage will be a reduced deflection. This increase in thickness can also for example be implemented by adding/mounting other layers onto the membrane 402, from the same material or different materials.

It should be noted that, although the increased thickness can result in a reduced deflection, depending on the design parameters it can result in a higher volume displacement.

Reduction of the membranes thickness in the center of the membrane 302 results in higher achieved deflections due to the reduced flexural rigidity of the membrane, in the cost of reducing the working pressure and generated force.

The tuning between higher achieved deflections or higher achieved pressure/force can give the designer the option to optimize the desired characteristic in every application. For example, in micropump applications, the higher deflection of the actuator can result in higher generated flowrate. In microvalve applications, having a higher achieved deflection in the actuator enables the valve to achieve higher flow factors.

On the other hand, higher pressure and force capability of the actuator can result in higher achieved backpressure in micropump applications, or can result in higher working pressure ranges in microvalve applications.

Figure 5:
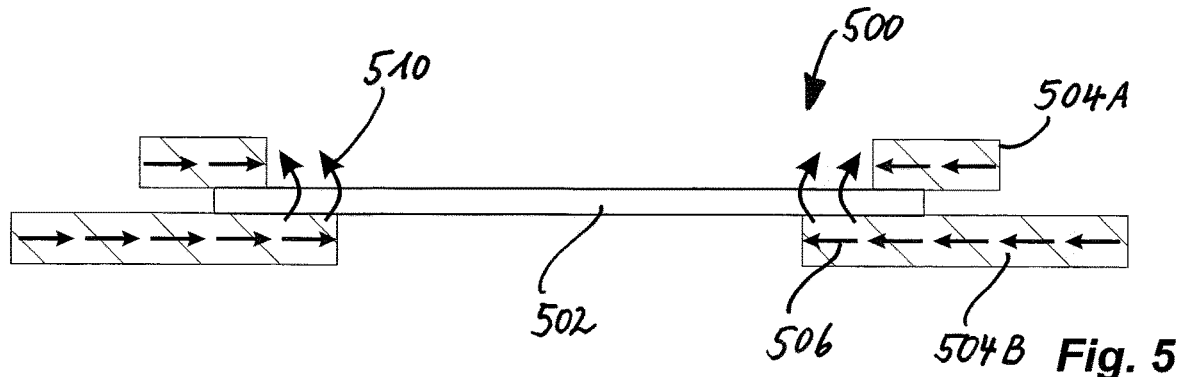
FIG. 5 shows a schematic cross-sectional representation of a piezoelectric actuator according to a further embodiment.

In order to generate asymmetric forces in the two piezo-electric elements to emphasize the generated deflection/force more towards one direction, several approaches can be used. Beside the approach of applying asymmetric voltages to the two piezoelectric elements 504, as shown in the piezoelectric actuator 500 of FIG. 5, the piezoelectric ele-ments' 504A, 504B dimensions can differ from one another to further emphasize the generation of asymmetry towards the desired direction. Creating more radial contraction in one of the piezoelectric elements 504A, 504B compared to the other one (as shown with black arrows 506) generates a net bending moment in the deflectable membrane 502 (shown with arrows 510 in FIG. 5) beside the buckling forces, due to the higher force-multiplied-by-distance to the neutral axis generated by the bigger ring-shaped piezoelec-tric element 504B.

Figure 6:
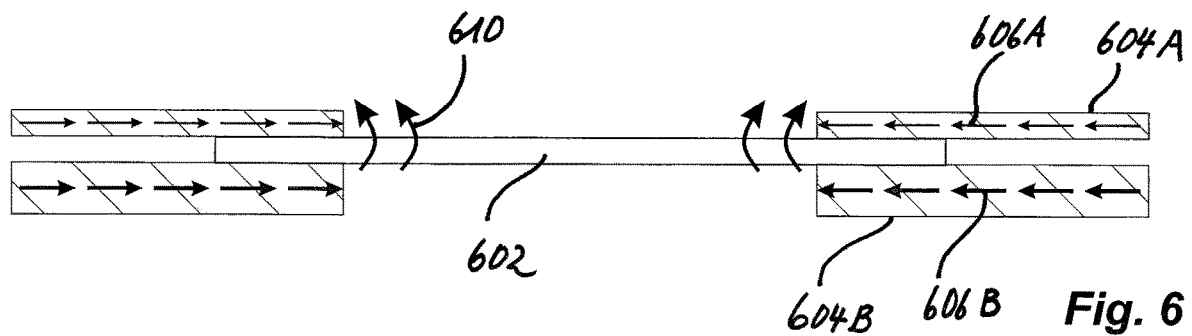
FIG. 6 shows a schematic cross-sectional representation of a piezoelectric actuator according to a further embodiment.

A further example of a piezoelectric actuator 600 with asymmetric forces generated by the piezoelectric elements 604 is shown in FIG. 6. According to this example, the thickness of two opposing piezoelectric elements 604A, 604B differs, while the diameters of the piezoelectric ele-ments 604A, 604B are equal. It should be noted that, of course, also additionally differing diameters can be pro-vided. By using piezoelectric elements 604A, 604B with different thicknesses, asymmetric forces on the deflectable membrane 602 are generated due to two effects. Firstly, the electric field generated by a given applied voltage changes. Secondly, the stress characteristics of the piezoelectric ele-ments 604A, 604B varies depending on the thickness. FIG. 6 schematically illustrates this effect. When the same elec-trical field is applied to the piezoelectric elements 604A, 604B, higher forces 606B are generated in the thicker piezoelectric element 604B and lower forces 606A are generated in the thinner piezoelectric element 604A. Thus, a resulting bending moment 610 is generated together with the net buckling forces.

Figure 7:
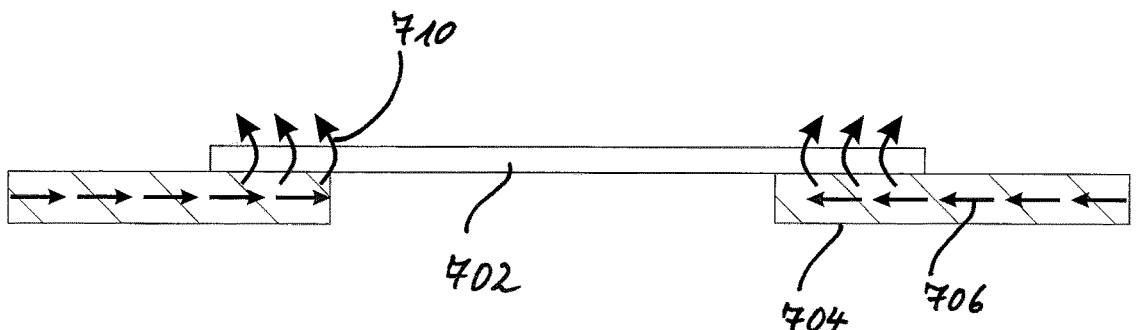
FIG. 7 shows a schematic cross-sectional representation of a piezoelectric actuator according to a further embodiment.

A further advantageous example of a piezoelectric actua-tor 700 according to the present invention is shown in FIG. 7. As shown in this Figure, an asymmetry of the actuating forces can be achieved by providing a ring-shaped piezo-electric element 704 only on one side of the membrane 702. Compared to the previously described configuration, this configuration results in creating a higher bending moment 710 due to the lack of opposition by another piezoelectric element due to the lack of opposition by the opposing piezo. However, the configuration shown in FIG. 7 has the disad-vantage that the generated buckling forces are lower. Another disadvantage is the reduction of bending control because in this configuration, the bending moments 710 are limited to those generated by the buckling forces (or tension forces of the piezoelectric element 704, in case they are activated to move in the opposite direction than the inward buckling direction), considering that these forces are applied with a distance from the structure's neutral axis.

As illustrated schematically as a top view in FIG. 8, a piezoelectric actuator 800 according to the principles of the present invention is of course not limited to circular shapes. The same concept can be used for other shapes, such as rectangular and oval or even nonhomogeneous or arbitrary forms which can result in the same buckling 806 effect by the piezoelectric elements 804 on the deflectable membrane 802, as shown in FIG. 8.

According to further advantageous examples of the pres-ent disclosure, the membrane may comprise multiple sec-tions each comprising a different material, or even voids or empty regions. As shown in the piezoelectric actuator 900 of FIG. 9, for instance, a material with a high stiffness, i. e. a high Young's modulus, can be provided in a central region 912 of the membrane 902, in order to achieve higher force and pressure capabilities. Another more flexible material may be used in the peripheral region 914. This allows for a more flexible applied boundary condition at the periphery of the membrane 902. Accordingly, a non-zero slope can be achieved at a position where the mounting device (the support device) 908 is located. This leads to a higher final deflection of the membrane 902 by the piezoelectric ele-ments 904A, 904B.

Alternatively, as shown in FIG. 10, a flexible spacer 1016 may be provided between the piezoelectric elements 1004A, 1004B to create a more flexible applied boundary condition at the periphery of the membrane 1002. The spacer 1016 material may also have the shape of a ring which is con-nected to the membrane 1002 by one or more radially extending webs. Such an arrangement has the advantage that the spacer 1016 can be aligned and assembled more easily. The spacer 1016 and the membrane 1002 can be cut from the same material, to reduce the fabrication and assembly steps. According to this example, the support device 1008 is provided within the region of the piezoelectric elements 1004A, 1004B. The area between the piezoelectric elements 1004A, 1004B is filled with the spacer 1016 in order to act as a more flexible support without hindering the transfer of inwardly directed forces of the piezoelectric elements 1004A, 1004B, which have to be transferred to the central part of the membrane 1002.

Figures 11, 12, 13, 14:
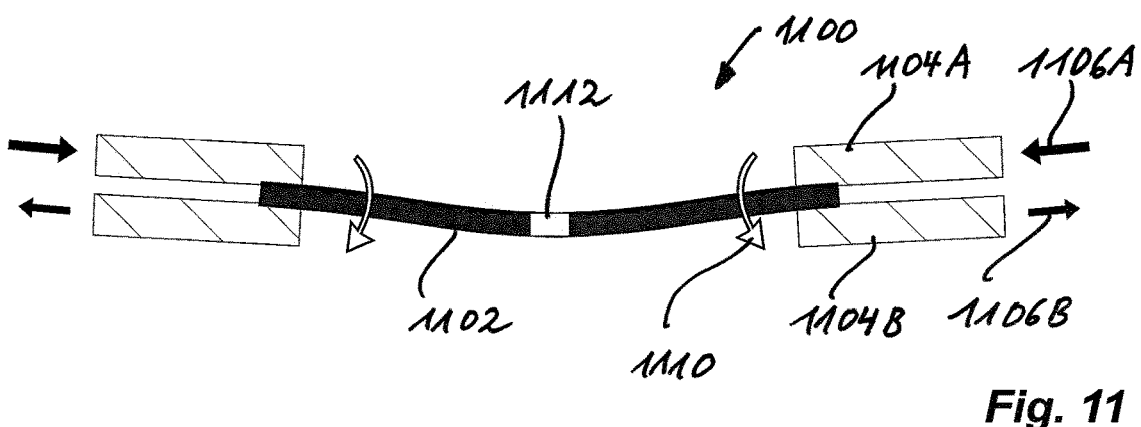
FIG. 11 shows a schematic cross-sectional representation of a piezoelectric actuator according to a further embodiment.
FIG. 12 shows a schematic cross-sectional representation of a piezoelectric actuator according to a further embodiment.
FIG. 13 shows a schematic cross-sectional representation of a piezoelectric actuator according to a further embodiment.
FIG. 14 shows a schematic cross-sectional representation of a piezoelectric actuator according to a further embodiment.

A further advantageous example of a piezoelectric actua-tor 1100 is shown in FIG. 11. According to this example, the material properties of the membrane 1102 vary for instance in a radial direction. The material properties may be changed by further treatments, for instance with thermal treatment such as annealing and sintering, with laser aberration, with alloy phase change or the like. FIG. 11 shows one example where the central part 1112 of the membrane 1102 is hardened. In case of the application in a microvalve, this hardening of the central region 1112 can increase the established leak-tight area between the central part 1112 of the membrane 1102 and a valve seat, which increases the dynamic working pressure of the valve. As illustrated in FIG. 11, the piezoelectric elements 1104A, 1104B exert different radial forces 1106A, 1106B on the membrane 1102. Thus, bending forces 1110 are generated in addition to the mere buckling forces.

FIGS. 12 to 16 illustrate a further advantageous embodiment of the present invention where at least one bending piezoelectric element 1214 is provided in addition to the piezoelectric elements 1204A, 1204B that generate buckling forces. By adding such a bending piezoelectric element 1214 to the central region 1212 of the membrane 1202, the traditional bending configuration can be combined with the more recent buckling approach. An extra bending moment is applied by the bending piezoelectric element 1214 by expansion or contraction. The bending piezo 1214 can also eliminate the need for a double-buckling-piezo configuration by providing the required bending moment to control the actuator towards the desired direction (by contracting or expanding). The buckling forces from the side then just have amplifying effects on the force and deflection.

As shown in FIG. 12, one such bending piezoelectric element 1214 is attached to a central region 1212 of the membrane 1202. Consequently, the membrane 1202 of the piezoelectric actuator 1200 is actuated by two piezoelectric elements 1204A, 1204B in a radial direction and is additionally bent by the contraction and expansion (symbolized by the double arrows 1216) of the bending piezoelectric element 1214. Thus, the force and pressure carrying capabilities of the piezoelectric actuator 1200 are improved.

As shown in FIG. 13, attaching a bending piezoelectric element 1314 to a central region of the membrane 1302 may even eliminate the necessity of providing two opposing piezoelectric elements arranged on both sides of the membrane 1302. Instead, only one piezoelectric element 1304 is arranged on one surface of the membrane 1303. In this case, the bending moment 1310 which is needed to control the actuator 1300 towards a desired direction is created by expansion or contraction of the bending piezoelectric element 1314. In FIG. 13, for instance, expansion of the bending piezoelectric element 1314 will cause the membrane 1302 to bend upwards. The buckling forces 1306 exerted from the side towards the center just have amplifying effects on the force and resultant deflection.

According to a further aspect of the present disclosure, which is shown FIG. 14, the pair of opposing buckling piezoelectric elements is replaced by one single piezoelectric element 1404 in a piezoelectric actuator 1400. For instance, a tube shaped piezoelectric element 1406 may be provided for causing the radially oriented buckling forces 1406 on the membrane 1402. This tube shaped piezoelectric element 1404 interacts with an outer circumferential face 1418 of the membrane 1402 instead of a upper or lower surface 1420, 1422 as this was shown for the previous examples. Thus, the piezoelectric element 1404 applies pure tension or compression (buckling) forces to the membrane 1402, so that the force and deflection produced by the expansion and contraction 1416 of the bending piezoelectric element 1414, which is located in a central region 1412 of the membrane 1402, is amplified.

Figures 15, 16, 17:
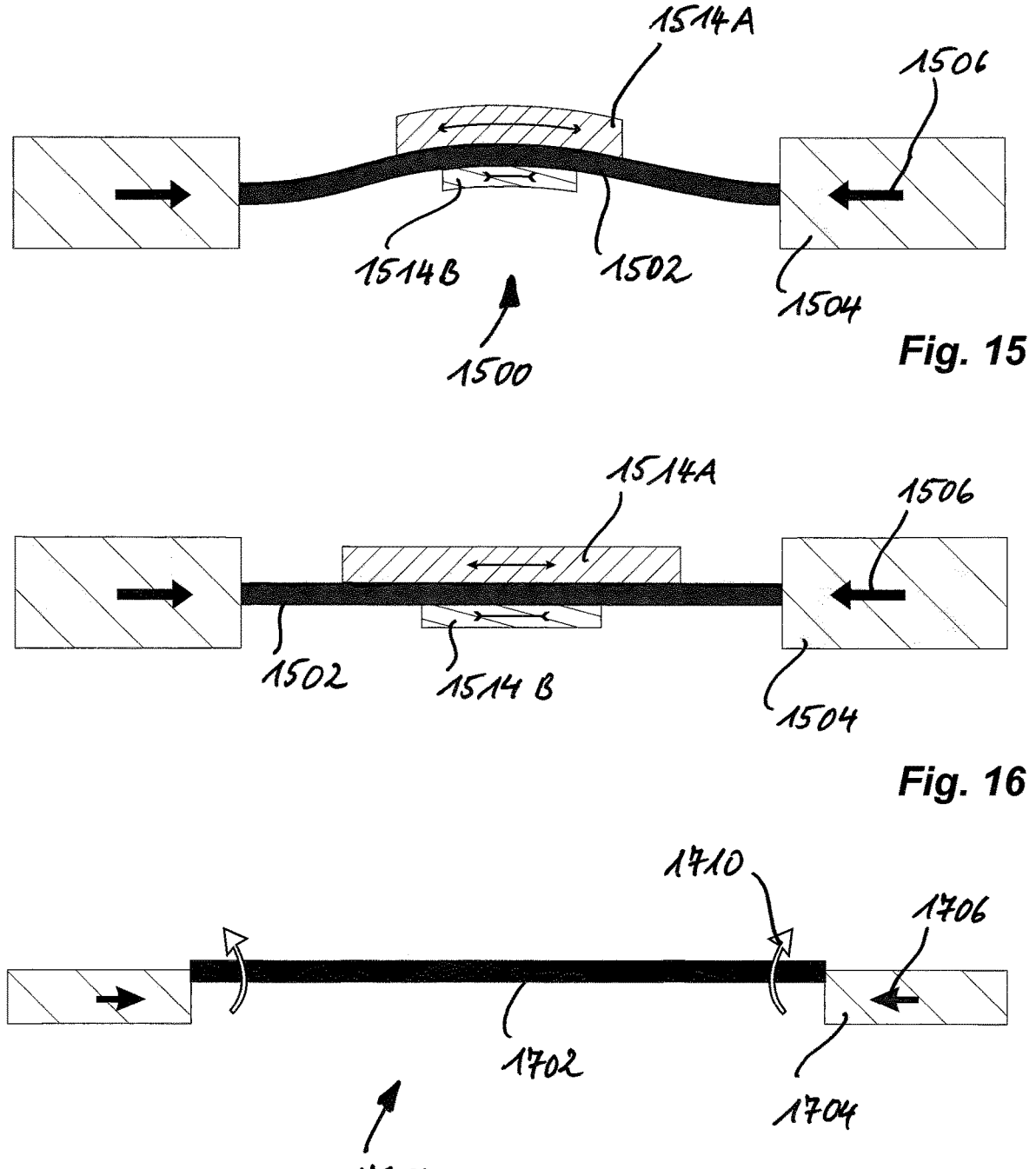
FIG. 15 shows a schematic cross-sectional representation of a piezoelectric actuator according to a further embodiment in a deflected position.
FIG. 16 shows a schematic cross-sectional representation of the piezoelectric actuator of FIG. 15 in a neutral position.
FIG. 17 shows a schematic cross-sectional representation of a piezoelectric actuator according to a further embodiment.

As further shown for the piezoelectric actuator 1500 depicted in FIGS. 15 and 16, there can be several bending piezoelectric elements 1514 in combination with buckling piezoelectric elements 1504 (or 1204), for example in different locations of the membrane 1502 to create more complicated shapes, or on both sides of the membrane 1502 (such as shown in FIGS. 15 and 16) to create more bending moment. The bending moment can be increased in this case, which for example simplifies the flow control of a proportional valve, especially as it reduces the bifurcation of buckling, when the membrane 1502 is close to its midway (initial) position. FIGS. 15 and 16 show an example of this configuration in two operational states (the deformed and neutral state, respectively). The bending piezoelectric elements 1514A, 1514B are in this example centrally and symmetrically located on the membrane 1502. The same direction of bending is applied by one 1514A of the bending piezoelectric elements expanding, and the other one 1514B contracting.

FIG. 17 shows a further advantageous example of a piezoelectric actuator 1700. According to this example, only one buckling piezoelectric element 1704 (such as a tube) is placed asymmetrically with respect to the neutral axis of the membrane 1702 to produce the combination of buckling forces 1706 together with a bending moment 1710 in the membrane 1702. The piezoelectric element 1704 is attached to only a part of the outer circumferential end face of the membrane 1702.

Figures 18, 19, 20, 21:
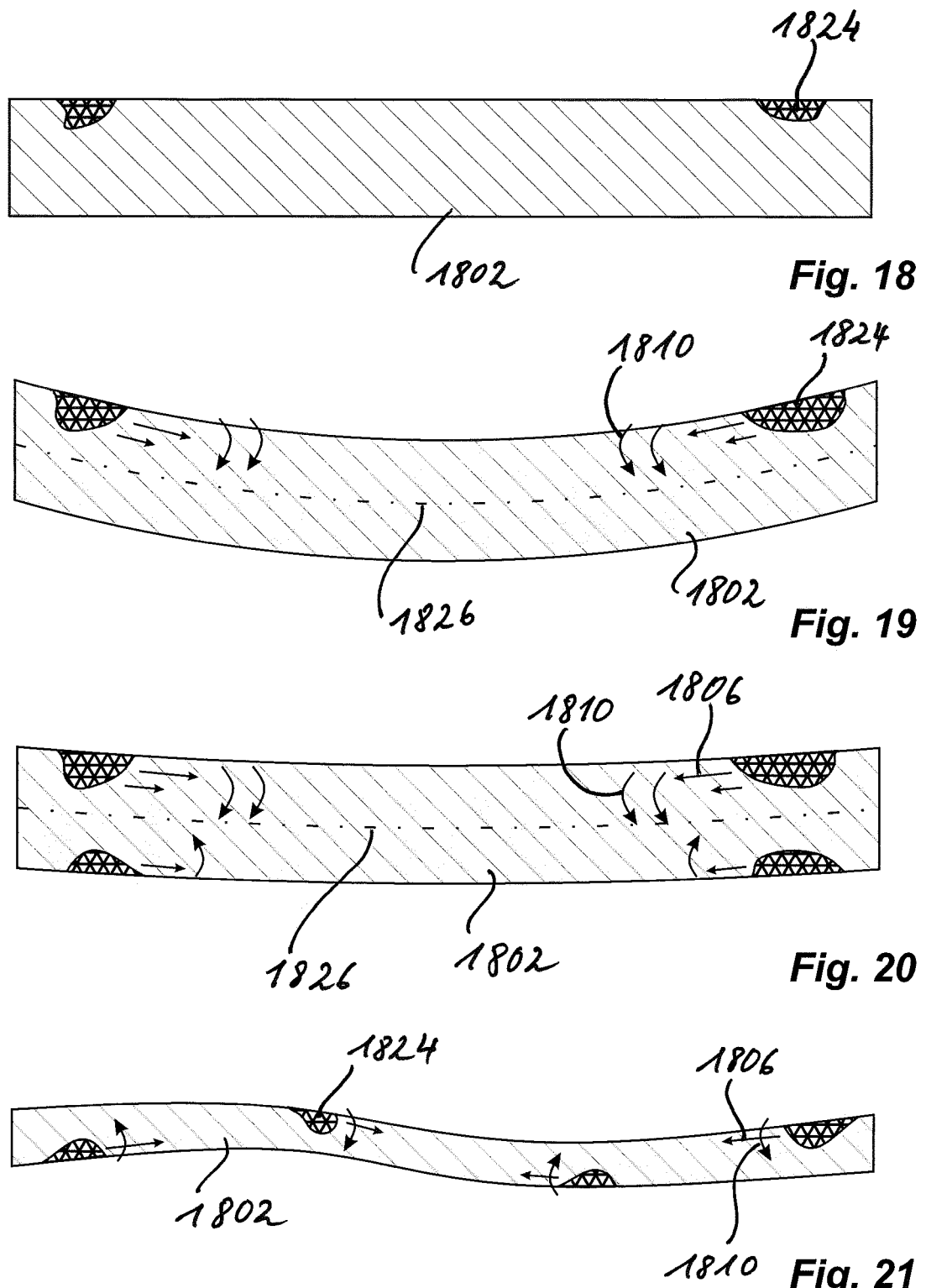
FIG. 18 shows a schematic cross-sectional representation of a membrane according to a further embodiment.
FIG. 19 shows a schematic cross-sectional representation of a membrane according to a further embodiment.
FIG. 20 shows a schematic cross-sectional representation of a membrane according to a further embodiment.
FIG. 21 shows a schematic cross-sectional representation of a membrane according to a further embodiment.

As will be explained with reference to FIGS. 18 to 21, a pre-buckling in the membrane 1802 can be achieved by generating local changes of the material characteristics. For instance, a laser treatment of the membrane's surface is performed to cause various range of physical or chemical changes such as thermal expansion, oxidation, material and/or alloy phase change, etc. This results in different effects such as local volume changes, swelling, or concentrated pre-stress in the material. These effects can be used to generate a pre-stress or pre-strain state which also causes a pre-deflection, such as a pre-buckling in the membrane 1802. FIG. 18 for example shows an initially flat membrane 1802 with initial state of the regions 1824 which are supposed to be affected by special treatment such as lasering.

These areas 1824 are then expanded as shown in FIG. 19, creating a radial force which due to its distance from the neutral axis 1826 also results in a bending moment 1810 around this axis. The result is a membrane 1802 which is deformed in the form of pre-buckling and/or pre-bending. The amount of pre-buckling can be changed and tuned by various lasering parameters (for example pulse rate, frequency, power, etc.), geometrical parameters (places to target, pattern, number of repetition, etc.), thermal and other parameters.

Furthermore, exposing the other side of the membrane as well can increase the buckling force 1806, but reduce the bending moment 1810, as shown in FIG. 20. Therefore, different magnitudes as well as different states of pre-buckling can be achieved. The membrane 1802 can be treated to be mono-stable (only having one stable equilibrium on one side), or bi-stable (having two stable equilibrium states i.e. on both sides). Even more complicated shapes or other modes of pre-buckling can also be realized with more complicated combinations such as different laser patterns as shown schematically in FIG. 21.

As shown for the piezoelectric actuators 2200, 2300 depicted in FIGS. 22 and 23, the membrane 2202, 2302 may be formed to have an initial curvature due to a pre-stress, such as pre-bending, pre-buckling or a material treatment as shown in FIGS. 18 to 21. Such an initial curvature pronounces an asymmetric deflection and force in the desired direction. Furthermore, this curvature reduces the required force to achieve a certain deflection in operation.

FIG. 24 shows a further advantageous aspect of a piezoelectric actuator 2400 according to the present invention. According to this example, the membrane 2402 comprises a central portion 2412 which is hardened in order to enhance the forces that can be exerted for instance against a valve seat by the bending imparted by the piezoelectric element 2404.

As an exemplary application of a piezoelectric actuator, FIGS. 25 to 28 illustrate a fluidic control device 2500 comprising a piezoelectric actuator 1000 as shown in FIG. 10. According to this example, the microfluidic control device 2500 has a base 2528 and a cover 2530. The piezoelectric actuator 1000 is fixed between the base 2528 and the cover 2530 by two elastic O-rings 1008 held in notches 2532. The base 2528 comprises an inlet 2534 and an outlet 2536. A valve seat 2538 surrounds the inlet 2534 and the membrane 1002 is arranged close to the valve seat 2538, so that with a downwardly oriented displacement of the membrane 1002 interacts with the valve seat 2538 to close the fluidic path from the inlet 2534.

Figures 25, 26, 27, 28:
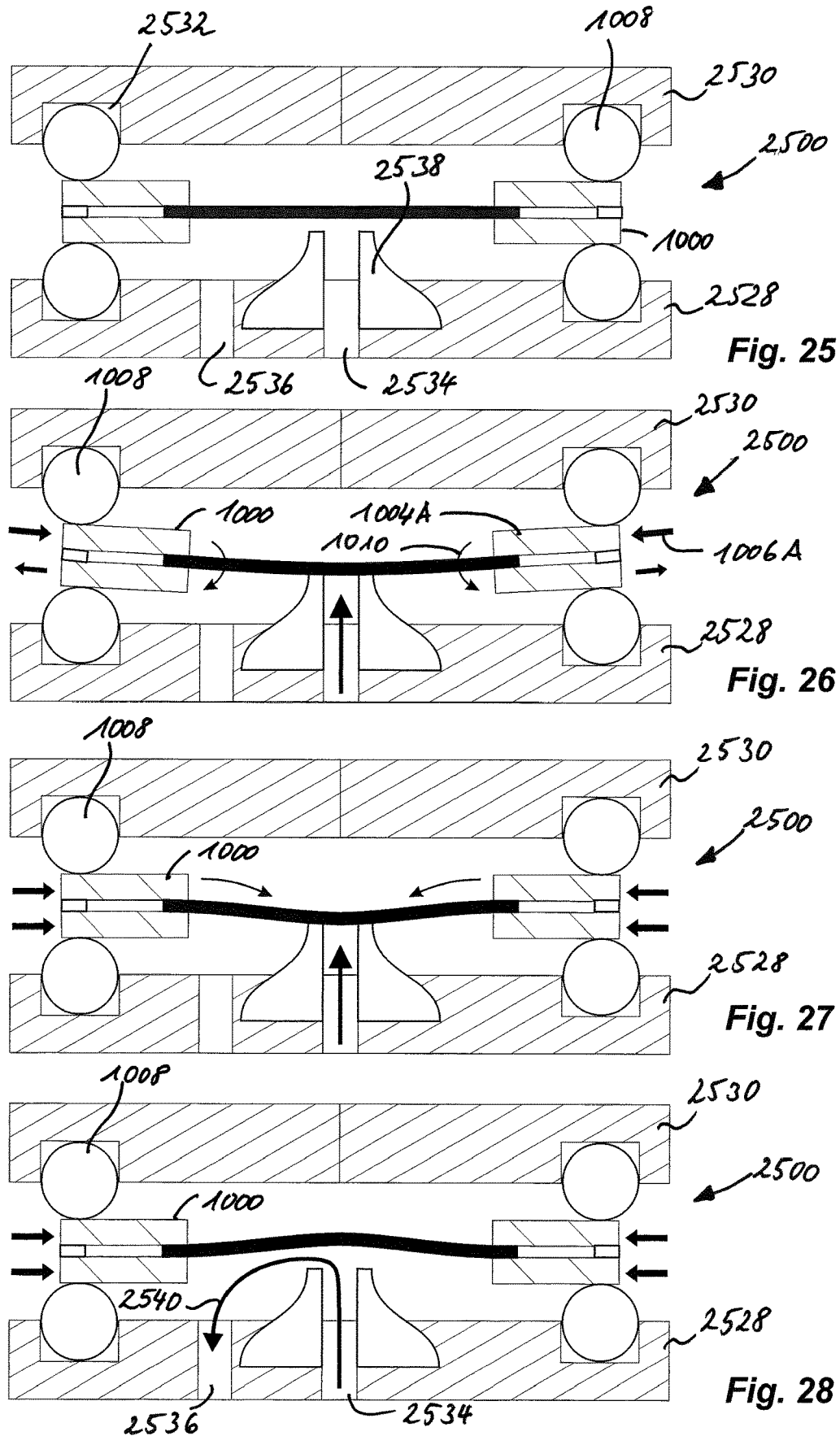
FIG. 25 shows a schematic cross-sectional representation of a microvalve according to an advantageous embodiment in a first operational state.
FIG. 26 shows a schematic cross-sectional representation of the microvalve of FIG. 25 in a second operational state.
FIG. 27 shows a schematic cross-sectional representation of the microvalve of FIG. 25 in a further operational state.
FIG. 28 shows a schematic cross-sectional representation of the microvalve of FIG. 25 in a further operational state.

FIG. 25 shows the fluidic control device 2500 in its initial state. By contracting one of the piezoelectric elements and expanding the other one, the actuator 1000 bends toward the expanded piezoelectric element, as shown in FIG. 26, in which the actuator bends towards the valve seat 2538. Advantageously, the flexible support by the O-rings 1008 allows a non-zero slope of the actuator 1000 and thus the membrane, as can be seen from this Figure. Instead of the fixed boundary condition of a firmly clamped cantilever, this allows for a higher final deflection of the membrane. The O-rings 1008 serve as a hinge and at the same time as a sealing material. Of course, also other flexible support devices, for instance laminated silicone layers, may also be employed instead of a pair of O-rings 1008 shown in FIGS. 25 to 28.

The actuator 1000 can buckle in the already bent direction, if both piezoelectric elements contract, as shown in FIG. 27. In the similar manner, the actuator 1000 can bend and buckle away from the valve seat 2538 to open the fluidic connection 2540 between the inlet 2534 and outlet 2536 ports, as shown in FIG. 28. As the gap between the membrane 1002 and valve seat 2538 is a key factor in defining the flow through of a valve, by controlling the deflection of the actuator and therefore the resulting gap, a proportional valve can be realized which controls the flowrate and/or pressure of the fluid. The microfluidic device 2500 is operable as a micropump, wherein the moving actuator 1000 pushes the fluid out of at least one of the ports 2534, 2536.

Although not shown in the Figures, at least one compressible, and in an embodiment elastic sealing layer may be provided between the membrane and the valve seat 2538. This layer serves a sealing purpose and may either be attached to the surface of the valve seat 2538 or to the surface of the membrane or to both surfaces. For instance, a laminated silicone layer can be applied as the sealing layer.

Moreover, the valve seat 2538 may be formed as one integral part with the base 2528, thus being a hard valve seat.

The piezoelectric elements according to the present disclosure do not necessarily have a uniform thickness and may have a non-planar shape. No limitations are intended regarding the adhesion between the piezoelectric elements and the various membranes. No limitations are intended with respect to the polarization direction, the electrode structure of the piezoelectric elements, and the applied voltage directions. The only important point is that, regardless of the polarization and applied voltage, axially compressive buckling forces are generated.

Furthermore, each piezoelectric element may comprise an array of piezoelectric elements or be fabricated in the form of a stack, to reduce the applied voltage while maintaining the same electric field, or to increase the applied force.

All the above references to the micropump and microvalve applications are only to clarify the advantages of tuning the performance, and are not intended to limit the application to these fields. Other applications can be adaptive optics (such as adaptive lenses and adaptive mirrors), precision movement, MEMS acoustics (such as microphones and loudspeakers), and the like.

What is claimed is:

1. A piezoelectric actuator, comprising:
   a deflectable membrane; and
   at least one piezoelectric element attached to a part of the deflectable membrane for exerting a mechanical force on the deflectable membrane, the piezoelectric element is operable to perform an expansion and a contraction motion depending on an electric field applied to the piezoelectric element, the piezoelectric element has a peripheral outline that does not coincide with an outline of the deflectable membrane, and
   wherein the piezoelectric actuator comprises an elastic support device for supporting the piezoelectric actuator.

2. The piezoelectric actuator of claim 1, wherein the piezoelectric element is a ring-shaped planar plate attached to the deflectable membrane.

3. The piezoelectric actuator of claim 2, wherein a ring-shaped inner region of the piezoelectric element covers a ring-shaped peripheral region of the deflectable membrane.

4. The piezoelectric actuator of claim 1, wherein the piezoelectric element includes a first ring-shaped planar plate and a second ring-shaped planar plate.

5. The piezoelectric actuator of claim 4, wherein the first ring-shaped planar plate and the second ring-shaped planar plate have outer and/or inner diameters that differ from one another.

6. The piezoelectric actuator of claim 4, wherein the first ring-shaped planar plate and the second ring-shaped planar plate are attached to a pair of opposing peripheral surfaces of the deflectable membrane.

7. The piezoelectric actuator of claim 4, wherein the first ring-shaped planar plate and the second ring-shaped planar plate have differing thicknesses.

8. The piezoelectric actuator of claim 4, wherein a void between the first ring-shaped planar plate and the second ring-shaped planar plate is at least partially filled with a spacer material.

9. The piezoelectric actuator of claim 2, wherein the ring-shaped planar plate has an outer diameter that is larger than an outer diameter of the deflectable membrane.

10. The piezoelectric actuator of claim 2, wherein the ring-shaped planar plate abuts an outer circumferential end face of the deflectable membrane.

11. The piezoelectric actuator of claim 10, wherein the piezoelectric element is attached to only a part of the outer circumferential end face of the deflectable membrane.

12. The piezoelectric actuator of claim 1, wherein a thickness of the deflectable membrane varies along a radial direction of the deflectable membrane.

13. The piezoelectric actuator of claim 1, wherein the deflectable membrane has a plurality of regions fabricated from different materials.

14. The piezoelectric actuator of claim 1, further comprising a bending piezoelectric element attached to the deflectable membrane in a central region of the deflectable membrane, the bending piezoelectric element applies a bending moment on the deflectable membrane.

15. The piezoelectric actuator of claim 1, wherein the deflectable membrane has a plurality of regions with material modifications.

16. The piezoelectric actuator of claim 15, wherein the deflectable membrane has a pre-defined deflected shape without the piezoelectric element exerting the mechanical force on the deflectable membrane.

17. A microfluidic device, comprising:

a piezoelectric actuator including a deflectable membrane and at least one piezoelectric element attached to a part of the deflectable membrane for exerting a mechanical force on the deflectable membrane, the piezoelectric element is operable to perform an expansion and a contraction motion depending on an electric field applied to the piezoelectric element, the piezoelectric element has a peripheral outline that does not coincide with an outline of the deflectable membrane, and wherein the piezoelectric actuator comprises an elastic support device for supporting the piezoelectric actuator.

18. The microfluidic device of claim 17, further comprising a pair of fluid ports and a valve seat arranged around one of the pair of fluid ports and protruding from the one of the fluid ports toward the deflectable membrane.

19. The microfluidic device of claim 18, wherein the deflectable membrane is operable to close and open a fluidic pathway by contacting and moving away from the valve seat.

20. The microfluidic device of claim 17, further comprising a pair of fluid ports, the piezoelectric actuator is operable to expel a fluid out of at least one of the pair of fluid ports.

21. The microfluidic device of claim 17, wherein, by controlling a deflection of the deflectable membrane, a proportional valve is formed which controls a flowrate and/or pressure of a fluid.

22. The piezoelectric actuator of claim 1, wherein the deflectable membrane is deflectable in two opposing directions.

23. The piezoelectric actuator of claim 1, wherein the piezoelectric element comprises at least one ring-shaped planar plate which is attached to the deflectable membrane and has an outer diameter that is smaller than an outer diameter of the deflectable membrane, wherein an extension of the deflectable membrane beyond the piezoelectric elements' dimensions is usable for mounting the piezoelectric actuator.

24. The piezoelectric actuator of claim 1, further comprising one or more bending piezoelectric elements attached to one or both opposing surfaces of different locations of the deflectable membrane.

25. The piezoelectric actuator of claim 24, wherein both a central region and a peripheral region of one or both opposing surfaces of the deflectable membrane comprise piezoelectric elements and/or bending piezoelectric elements.

26. A piezoelectric actuator, comprising:

a deflectable membrane being deflectable in two opposing directions; and at least a first piezoelectric element and at least a second piezoelectric element, attached to opposing surfaces of the deflectable membrane for exerting a mechanical force on the deflectable membrane, the piezoelectric elements being operable to perform an expansion and/ or a contraction motion depending on electric fields applied to the piezoelectric elements, wherein an outer outline diameter of the first and/or the second piezoelectric elements, in at least a portion, is larger than an outer outline diameter of the deflectable membrane.

27. The piezoelectric actuator of claim 26, wherein the piezoelectric actuator comprises an elastic support device for supporting the piezoelectric actuator, the elastic support device being provided at the piezoelectric element or at a spacer arranged around the deflectable membrane.

28. The piezoelectric actuator of claim 26, wherein a flexible spacer material at least partly fills a void between the first and second piezoelectric elements.

29. The piezoelectric actuator of claim 28, wherein the flexible spacer material comprises a ring-shaped structure cut from the same material as the deflectable membrane, with one or more radially extending webs connecting it to the deflectable membrane.

30. A microfluidic device, comprising:

a piezoelectric actuator including a deflectable membrane being deflectable in two opposing directions; and at least a first piezoelectric element and at least a second piezoelectric element, attached to opposing surfaces of the deflectable membrane for exerting a mechanical force on the deflectable membrane, the piezoelectric elements being operable to perform an expansion and/or a contraction motion depending on electric fields applied to the piezoelectric elements, wherein an outer outline diameter of the first and/or the second piezoelectric elements, in at least a portion, is larger than an outer outline diameter of the deflectable membrane.

31. The piezoelectric actuator of claim 1, further comprising a flexible spacer material having a ring-shaped structure cut from the same material as the deflectable membrane, with one or more radially extending webs connecting it to the deflectable membrane.

32. The piezoelectric actuator of claim 26, wherein the first piezoelectric element is a first ring-shaped planar plate and the second piezoelectric element is a second ring-shaped planar plate.

33. The piezoelectric actuator of claim 32, wherein the first ring-shaped planar plate and the second ring-shaped planar plate have outer and/or inner diameters that differ from one another.

34. The piezoelectric actuator of claim 32, wherein the first ring-shaped planar plate and the second ring-shaped planar plate have differing thicknesses.

35. The piezoelectric actuator of claim 26, wherein a thickness of the deflectable membrane varies along a radial direction of the deflectable membrane.

36. The piezoelectric actuator of claim 26, wherein the deflectable membrane has a plurality of regions fabricated from different materials.

37. The piezoelectric actuator of claim 26, wherein the deflectable membrane has a plurality of regions with material modifications.

38. The piezoelectric actuator of claim 37, wherein the deflectable membrane has a pre-defined deflected shape without the first piezoelectric element and the second piezoelectric element exerting the mechanical force on the deflectable membrane.

39. The piezoelectric actuator of claim 26, wherein the deflectable membrane is deflectable in two opposing directions.

40. The piezoelectric actuator of claim 26, further comprising one or more bending piezoelectric elements attached to one or both opposing surfaces of different locations of the deflectable membrane.

41. The piezoelectric actuator of claim 40, wherein both a central region and a peripheral region of one or both opposing surfaces of the deflectable membrane comprise piezoelectric elements and/or bending piezoelectric elements.

42. The microfluidic device of claim 30, further comprising a pair of fluid ports and a valve seat arranged around one of the pair of fluid ports and protruding from the one of the fluid ports toward the deflectable membrane.

43. The microfluidic device of claim 42, wherein the deflectable membrane is operable to close and open a fluidic pathway by contacting and moving away from the valve seat.

44. The microfluidic device of claim 30, further comprising a pair of fluid ports, the piezoelectric actuator is operable to expel a fluid out of at least one of the pair of fluid ports.

45. The microfluidic device of claim 30, wherein, by controlling a deflection of the deflectable membrane, a proportional valve is formed which controls a flowrate and/or pressure of a fluid.

* * * * *